United States Patent
Joubert et al.

(10) Patent No.: US 6,818,488 B2
(45) Date of Patent: Nov. 16, 2004

(54) PROCESS FOR MAKING A GATE FOR A SHORT CHANNEL CMOS TRANSISTOR STRUCTURE

(75) Inventors: Olivier Joubert, Meylan (FR); Giles Cunge, Fontaine (FR); Johann Foucher, Grenoble (FR); David Fuard, Grenoble (FR); Marceline Bonvalot, St. Ismier (FR); Laurent Vallier, Meylear (FR)

(73) Assignees: Commissariat a l'Energie Atomique, Paris (FR); Centre National de la Recherche, Paris (FR)

( * ) Notice: Subject to any disclaimer, the term of this patent is extended or adjusted under 35 U.S.C. 154(b) by 0 days.

(21) Appl. No.: 10/332,451
(22) PCT Filed: Jul. 6, 2001
(86) PCT No.: PCT/FR01/02180
§ 371 (c)(1), (2), (4) Date: Sep. 8, 2003
(87) PCT Pub. No.: WO02/05336
PCT Pub. Date: Jan. 17, 2002

(65) Prior Publication Data
US 2004/0104411 A1 Jun. 3, 2004

(30) Foreign Application Priority Data
Jul. 7, 2000 (FR) .............................................. 00 08917

(51) Int. Cl.⁷ ..................... H01L 21/338; H01L 21/336; H01L 21/3205; H01L 21/302
(52) U.S. Cl. ....................... 438/179; 438/182; 438/286; 438/585; 438/704; 438/696; 438/712; 438/713; 257/388; 257/344
(58) Field of Search ................................ 438/179, 182, 438/286, 696, 704, 712, 713, 585; 257/388, 344

(56) References Cited

U.S. PATENT DOCUMENTS

| | | | |
|---|---|---|---|
| 4,371,407 A | 2/1983 | Kurosawa | |
| 4,497,107 A | * 2/1985 | Cogan | 438/192 |
| 4,931,136 A | * 6/1990 | Pausch et al. | 438/712 |
| 5,089,863 A | * 2/1992 | Satoh et al. | 257/388 |
| 5,272,100 A | 12/1993 | Satoh et al. | |
| 5,316,616 A | 5/1994 | Nakamura et al. | |
| 5,342,481 A | 8/1994 | Kadomura | |
| 5,471,080 A | 11/1995 | Satoh et al. | |
| 5,472,564 A | 12/1995 | Nakamura et al. | |
| 5,543,646 A | * 8/1996 | Satoh et al. | 257/344 |
| 5,650,342 A | 7/1997 | Satoh et al. | |
| 5,834,817 A | 11/1998 | Satoh et al. | |

FOREIGN PATENT DOCUMENTS

| EP | 0 050 973 A1 | 5/1982 |
|---|---|---|
| EP | 0 328 350 A2 | 8/1989 |
| JP | 6-314674 | 8/1994 |

* cited by examiner

Primary Examiner—John F. Niebling
Assistant Examiner—Ron Pompey
(74) Attorney, Agent, or Firm—Thelen Reid & Priest, LLP

(57) ABSTRACT

The invention relates to a process for making a gate for a CMOS transistor structure, made from a stack realized on a face in a semi-conducting material of a substrate, said stack comprising a gate isolation layer, a gate material layer and a gate mask in sequence, the process comprising the following steps:

a) anisotropic etching of the top part of the gate material layer not masked by the gate mask, this etching step leaving the bottom part of the gate material layer and leading to the formation of a deposit composed of etching products on the etching sides resulting from the anisotropic etching, b) treatment of the deposit composed of etching products, to make a protection layer reinforced against subsequent etching of the gate material, c) etching of the bottom part of the gate material layer as far as the gate isolation layer, this etching comprising isotropic etching of the gate material layer to make the gate shorter at the bottom than at the top.

14 Claims, 4 Drawing Sheets

PROCESS FOR MAKING A GATE FOR A SHORT CHANNEL CMOS TRANSISTOR STRUCTURE

TECHNICAL FIELD

The present invention relates to a process for making a gate for a short channel CMOS transistor structure.

STATE OF PRIOR ART

The polysilicon gate is the heart of a CMOS device. In a traditional approach, the gate is obtained by chaining a photolithography step followed by an etching step. The photolithography step defines the required dimension in a resin mask. The image obtained in the resin is then transferred by plasma into a polysilicon or amorphous silicon layer, usually doped. This step is carried out in a high-density plasma etching reactor. The gate manufacturing step is of primary importance since the dimension of the gate fixes the device operating speed. As a general rule, a deviation of the dimension up to 10% of the target dimension is authorized. A special effort is made to obtain perfectly straight etching sides (anisotropic etching) during the etching step, such that the dimension of the polysilicon at the bottom of the gate is equal to the dimension of the polysilicon at the top of the gate, itself fixed by the mask dimension to the first order of magnitude. This is illustrated by FIG. 1 that shows a cross section of part of a CMOS transistor structure being made. A resin mask 1 (or a hard mask) enabled the formation of a gate 2 from a polysilicon, amorphous silicon or SiGe alloy layer deposited on a silicon substrate 3 covered by a layer of gate oxide 4.

If the gate etching is anisotropic, the photolithography step is used to obtain the required gate dimension. This approach has been used for more than 40 years in microelectronics. Progress in lithography has made it possible to reduce the dimension of the transistor gates and therefore to increase their operating speed.

This type of polysilicon gate may be etched by chaining several different etching steps, with the objective of obtaining straight etching sides to respect the dimension defined by the lithography step as accurately as possible. The process usually comprises at least three steps, each of which performs a very precise role.

The first step is a breakthrough step that eliminates the native oxide present on the surface of the polysilicon before etching. This step is carried out under conditions which optimise elimination of this native oxide: high source power, strong polarization of the substrate holder. This step only lasts a few seconds since it is not very selective with respect to the gate mask and therefore causes its consumption.

The second step, called the main etching step, quickly etches the polysilicon and defines the etching anisotropy. It is generally done with gas mixtures such as $Cl_2/O_2$, $HBr/Cl_2/O_2$ or $HBr/O_2$. The presence of oxygen in the gas phase of the plasma enables the formation of silicon, oxygen and bromine or chlorine based etching products, depending on which mix is used. These etching products are deposited on the sides of the polysilicon while it is being etched. These non-volatile products only form when the energy of ions bombarding the substrate is greater than 70–80 eV. Therefore the polarization power applied to the substrate holder has to be adapted to the plasma density to enable the formation and atomisation of these etching products. The accumulation of etching products deposited on the sides of the polysilicon generates a passivisation layer that protects the sides of the polysilicon from spontaneous reactive chemical attack by neutral species of plasma (atomic chlorine or atomic bromine or excited atomic chlorine and bromine). For $Cl_2/O_2$, $HBr/Cl_2/O_2$ or $HBr/O_2$ type plasmas, surface analyses by X photoelectron spectroscopy show that the passivisation layer that forms during the main etching step is of the $SiO_xCl_yBr_z$ type, where x, y and z<1. It may be compared with a porous silicon oxide substoichiometric in oxygen but rich in bromine (in the case of an $HBr/O_2$ chemistry) or in chlorine (in the case of a $Cl_2/O_2$ chemistry). Its thickness is greater at the top of the gate (typically between 5 and 10 nm) than at the bottom of the gate (of the order of 1 to 2 nm). The thickness and the chemical composition of the passivisation layer depend on the mix of the etching gases and operating conditions of the plasma (RF power injected into the source, RF polarisation power applied to the substrate holder, working pressure, etching gas flow).

FIG. 2 shows the formation of a passivisation layer while the polysilicon layer is being etched. This figure shows the gate 2 in FIG. 1 during manufacturing by etching a polysilicon layer 5. A passivisation layer 7 is formed on the sides of the gate being formed under the action of the ions 6 that bombard the polysilicon layer with sufficient energy.

The third step is the over-etching step. This eliminates polysilicon residues that remain, if any, after the main etching step in the dense lines of small polysilicon. Its duration is of the order of 30 to 100% of the duration of the main etching step. During the over-etching step, the polarization power applied to the substrate holder is reduced to that applied during the main etching step (typically by a factor of 2) so as not to damage the gate oxide that protects the silicon substrate from structural and electrical damage that could be caused by the plasma. During the over-etching step, the passivisation layer is no longer supplied by etching products. The passivisation layer may then be eroded or completely etched by active species of the plasma (atomic chlorine, atomic bromine). In this case, the polysilicon is exposed to the active species. The resulting spontaneous etching reactions can cause severe distortions of the etching profiles. Therefore, in a standard etching process, if the anisotropy of the etching is to be perfect, the passivisation layer formed during the main etching step needs to be resistant enough so that it is not fully consumed while it is exposed to the over etching plasma.

The main etching step may possibly be separated in two distinct steps. A first step is identical to the step described previously. It is applied during about the $2/3$ or the $4/5$ of the thickness of the polysilicon layer. The RF polarization power applied to the substrate holder to etch the remaining thickness of polysilicon is very much reduced, within a range of values identical to that applied during the over etching step, so that the gate oxide is reached under mild plasma (landing step) conditions in order to minimize its consumption.

Table I shows an example of the use of the etching process for a process comprising a main etching step in two parts (main etching I and main etching II). In this example, it is considered that the plasma is a high-density inductive source capable of etching 200 mm substrates and that the power injected in the source is of the order of 500 W. The result is that the plasma density is of the order of $10^{11}$ ions/cm$^3$. The gas flows indicated and the working pressure are only given as examples. It is quite clear that the flows indicated for each gas can vary within a fairly wide range. The value of the RF power, called P, applied to the substrate holder in each step is only given for guidance. These values are different if the power injected in the source is different.

In this table, the gas flows are expressed in "sccm", in other words in normal cm³/minute. The pressure is expressed in mTorr for practical reasons (1 mTorr= approximately 0.133 Pa).

TABLE I

| Step | Chemistry in gaseous phase | Gas flow Pressure | P (W) |
|---|---|---|---|
| Breakthrough | C₂F₄ or Cl₂ | 100 sccm a few mTorr | P > 200 |
| Main etching I | HBr/Cl₂/O₂ | 150/30/5 sccm a few mTorr | 80 < P < 150 |
| Main etching II | HBr/Cl₂/O₂ | 150/30/5 sccm a few mTorr | 40 < P < 70 |
| Over-etching | HBr/O₂ | 150/10 sccm > 30 mTorr | 40 < P < 60 |

Recently, the specialized literature has started to include references to CMOS transistor structures with a notched gate bottom. For example, this is the case in article "100 nm Gate Length High Performance/Low Power CMOS Transistor Structure" by T. GHANI et al. published in the IEDM 1999 review, pages 415 to 418. Thus, a gate with a bottom length shorter than the top length is obtained. This is shown in FIG. 3 in which, in comparison with FIG. 1, the reference 11 denotes the mask, reference 12 denotes the gate, reference 13 denotes the substrate and reference 14 denotes the gate oxide layer. The effective electrical length of the gate is fixed by the intersection between polysilicon and the gate oxide, and the final result is a gate with an effective dimension less than the dimension fixed by the photolithography step. Therefore this configuration is attractive since it makes it possible to go beyond the resolution fixed by photolithography.

It may be assumed that the gate profile shown in FIG. 3 is obtained by means of etching that is anisotropic at first and then becomes strongly isotropic. One problem that can then arise is to control lateral erosion at the bottom of the gate in order to obtain a determined etching profile.

U.S. Pat. No. 5,834,817 describes a field effect transistor with a shaped gate electrode, this gate being shorter at the bottom than at the top. A stack is formed on one face made of a semi conducting material of a substrate, the stack comprising a gate isolation layer, a gate material layer and a gate mask in sequence. The process includes the following steps:

anisotropic etching of the top part of the layer of gate material not masked by the gate mask, this etching step leaving the bottom part of the layer of gate material and leading to the formation of a deposit composed of etching products, on the etching sides resulting from the anisotropic etching, etching of the bottom part of the gate material layer as far as the gate isolation layer, this etching comprising isotropic etching of the layer of gate material to make the gate shorter at the bottom than at the top.

SUMMARY OF THE INVENTION

The present invention proposes to machine the passivisation layer that is formed during etching of the gate to give it an anisotropic etching profile at its top and a very sharply isotropic profile at the bottom of the gate.

The purpose of the invention is a process for making a gate for a CMOS transistor structure for which the gate length is shorter at the bottom than at the top, made from a stack realized on a face in a semi-conducting material of a substrate, said stack comprising a gate isolation layer, a gate material layer and a gate mask in sequence, the process comprising the following steps:

a) anisotropic etching of the top part of the gate material layer not masked by the gate mask, this etching step leaving the bottom part of the gate material layer and leading to the formation of a deposit composed of etching products on the etching sides resulting from the anisotropic etching, c) etching of the bottom part of the gate material layer as far as the gate isolation layer, this etching comprising isotropic etching of the gate material layer to make to the gate a length shorter at the bottom than at the top, characterised in that there is a step b) between steps a) and c), for the treatment of the deposit composed of etching products, to make a protection layer reinforced against etching in step c).

The surface of the lower part of the gate material layer may be subjected to a cleaning step after step b) and before step c).

According to a first embodiment, step c) comprises two sub-steps:

firstly, an anisotropic etching step of the lower part of the gate material layer as far as the gate isolation layer, then a step consisting of submitting the stack to an over-etching plasma that causes said isotropic etching.

According to a second embodiment, step c) is made up by applying an over etching plasma to the stack to reach the gate isolation layer and to make to said gate a length shorter at the bottom than at the top.

The isotropic etching of the gate material layer may be done using reactive species reacting with the gate material in the absence of plasma.

According to one particular example embodiment, the deposit composed of etching products being of the $SiO_xC_{1-y}Br_z$ type where x, y and z<1 and y or z possibly being equal to 0, step b) consists of substituting the chlorine and/or bromine in the deposit composed of etching products, by oxygen. In this case, the substitution of the chlorine and/or bromine may be done by means of a gas plasma comprising at least one gas based on oxygen. The gas based on oxygen may be chosen from among $O_2$, $O_3$, $H_2O$, $N_2O$, NO, CO, $CO_2$, $SO_2$ or $SO_3$. The gas plasma may also comprise at least one gas chosen from among Ar, Xe, Kr, $NH_3$ and $N_2$. In this case, step b) can advantageously take place after the substrate has been placed on an unpolarised substrate holder.

According to another example of a particular embodiment, in step b), treatment of the deposit composed of etching products consists of depositing a polymer layer on said deposit composed of etching products. Treatment of the deposit composed of etching products may consist of depositing a layer of fluorocarbonated polymer, for example by using a $C_xF_yH_z$ type plasma. In this case, step b) preferably takes place after placing the substrate on a polarized substrate holder to prevent the deposit of a polymer layer on the surface of the lower part of the layer of gate material and to prevent etching of this surface.

The invention is particularly applicable to making a gate from a silicon-based material.

It is also applicable to making a metallic type gate, the layer of gate material comprising a sub-layer based on a semi-conducting material forming the top part of the gate material layer and a metallic sub-layer forming the lower part of the gate material layer.

BRIEF DESCRIPTION OF THE DRAWINGS

The invention will be better understood and other advantages and specificities will become clear after reading the following description given as a non-limitative example, accompanied by the appended drawings, wherein.

DETAILED DESCRIPTION OF EMBODIMENTS OF THE INVENTION

We will now describe how to make a first CMOS transistor structure according to the invention, with relation to FIGS. 4A to 4D.

Figure 1:
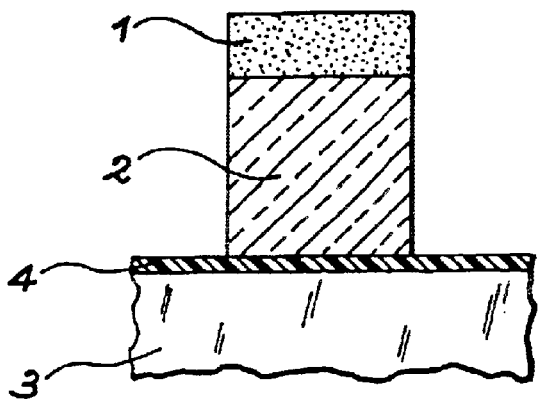
FIG. 1, already described, shows a cross section showing part of a CMOS transistor structure during manufacture, according to the prior art, FIG. 2, already described, shows the formation of a passivisation layer during an etching step of a gate material layer according to the prior art, FIG. 3, already described, shows a cross section through part of a CMOS transistor structure according to a recent proposal of the prior art.
Figure 2:
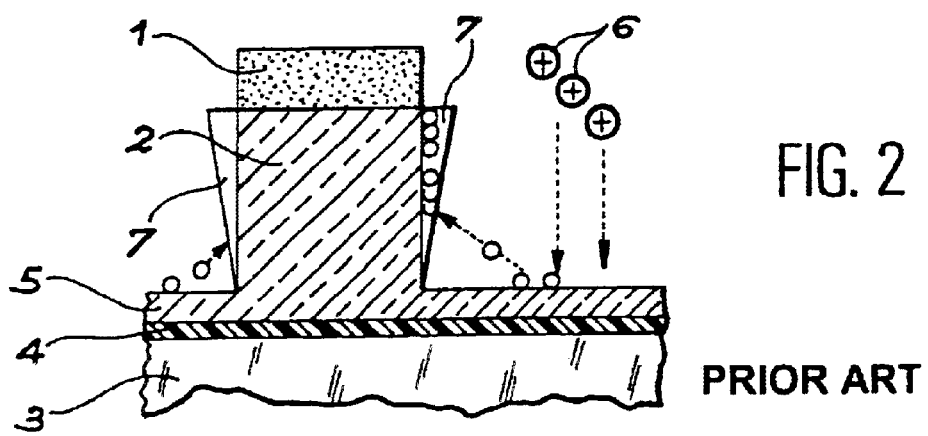
Figure 3:
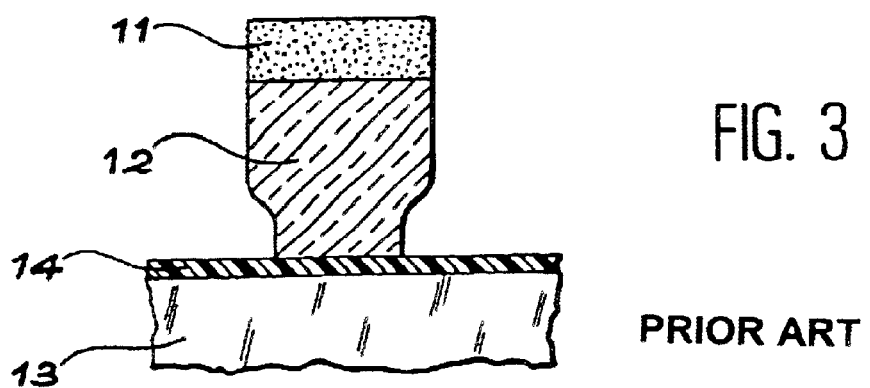
Figure 4:
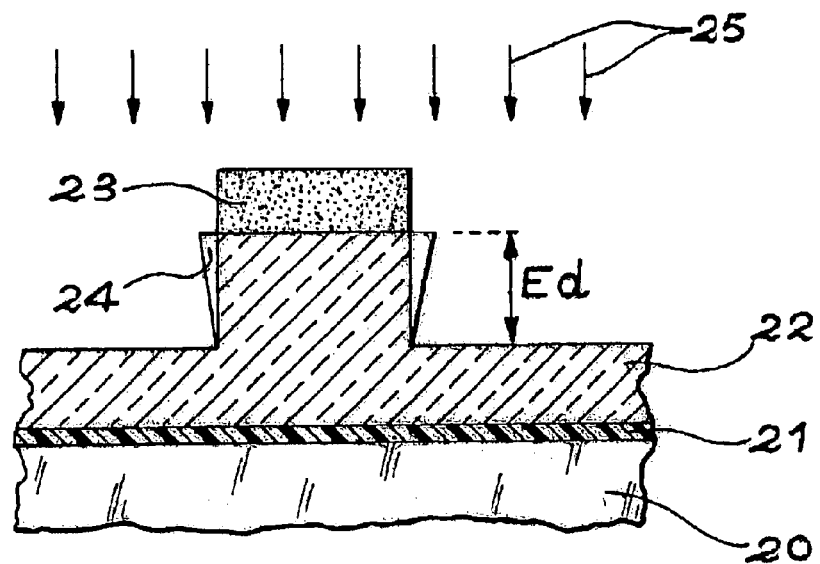
FIGS. 4A to 4D are cross sectional views illustrating steps in a process for making a CMOS transistor structure according to the invention.
Figure 4:
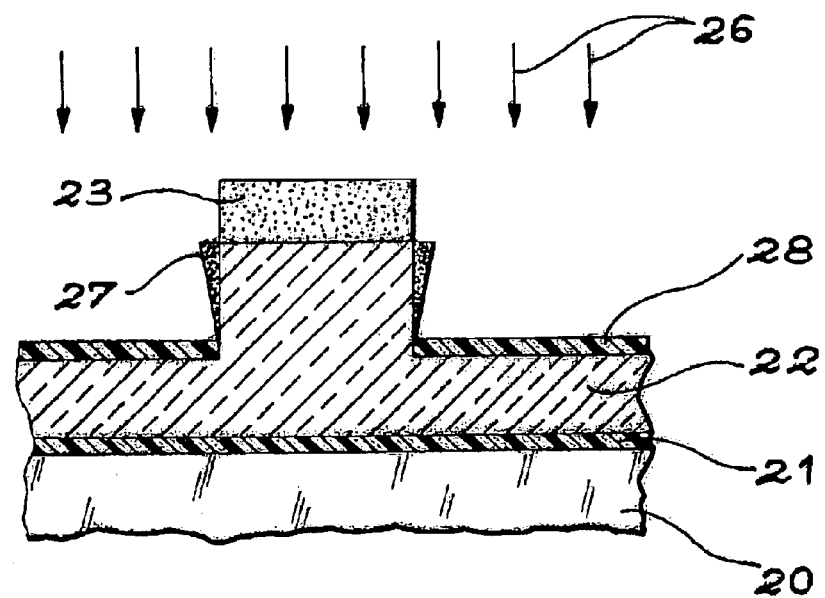

FIG. 4A shows a silicon substrate 20 supporting a silicon oxide layer 21, a gate of material layer 22 (for example polysilicon or amorphous silicon) and then a resin mask 23 in sequence. This figure shows the state of the structure during the anisotropic etching step of the top part of the gate material layer 22. A deposit 24 (or passivisation layer) composed of etching products is formed on the sides of the gate while it is being made. If the etching plasma 25 is an $HBr/Cl_2/O_2$ plasma, the deposit 24 is of the $SiO_xCl_yBr_z$ type where x, y and z<1. This passivisation layer 24 protects the sides of the gate during etching. It is thicker at the top than at the bottom of the gate and it has a certain porosity and substoichiometry in oxygen, that weakens it. The layer 24 is formed at a depth Ed by depositing etching products on the sides of the gate being created. For example, the etching step in which this layer is created may be the main etching step I in table I.

The passivisation layer 24 may be reinforced by exposure to an oxygen-based plasma 26 (see FIG. 4B). This exposure substitutes oxygen for the chlorine and bromine present in layer 24. This step transforms the passivisation layer into a protection layer 27 composed of an $SiO_x$ type material denser than the original layer and therefore more resistant to a subsequent etching step.

Gas mixes for reinforcing the passivisation layer by oxidizing it are oxygen based mixes. The $O_2$, $O_3$, $H_2O$, $N_2O$, NO, CO, $CO_2$, $SO_2$, $SO_3$ gases can be used to perform this operation. These gases may be mixed with neutral gases such as Ar, Xe, Kr and $NH_3$ or $N_2$ type gases. In order to oxidise the passivisation layer, a strongly dissociated high-density plasma generates strong concentrations of atomic oxygen in the gaseous phase. Oxidisation of the passivisation layer is more efficient when the power injected in the plasma is high. This technique has the disadvantage that it oxidises the surface of the gate material (oxide layer 28) that remains to be etched, which will necessitate a breakthrough step in the remainder of the process. To minimize oxidisation of the surface of the gate material, polarisation must not be applied to the substrate holder during oxidation of the passivisation layer.

Another solution for reinforcing the passivisation layer consists of exposing the layer to a $C_xF_yH_z$ plasma to deposit a layer of fluorocarbonated polymer on the etching sides. All $C_xF_yH_z$ type gases used for etching $SiO_2$ can be used, including $C_2F_6$, $C_4F_8$, $C_2F_4$, $C_3F_6$, $CHF_3$, $CH_3F$, etc. In the case of a $C_xF_yH_z$ plasma, it is important to avoid deposition of a polymer film on the surface of the gate material 22. To achieve this, the substrate holder that supports the substrate 20 is polarized so as to avoid the deposit of a polymer on this surface and so as to not etch the gate material. The polarisation power RF applied to minimize consumption of the gate material depends on the plasma density (therefore the RF power injected in the source) and the nature of the $C_xF_yH_z$ gas.

Two approaches can be considered to continue the process.

Figure 4C:
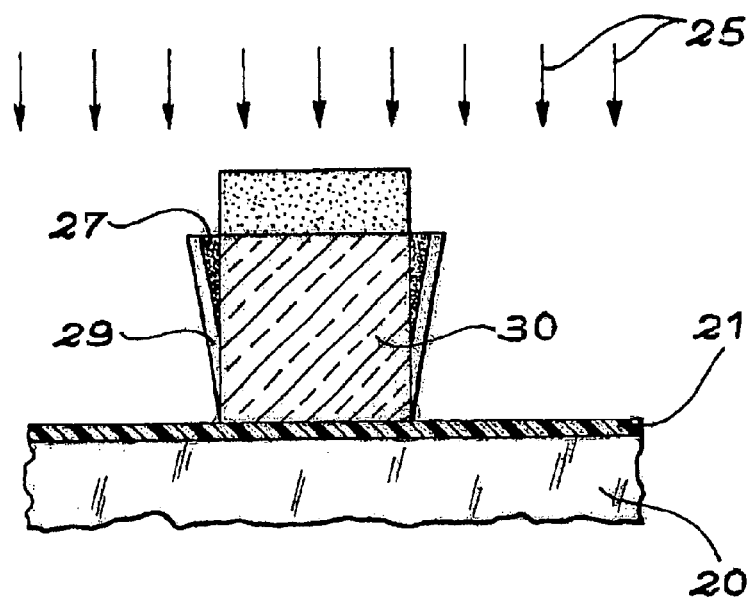

A first approach consists of continuing anisotropic etching of the layer of gate material 22 as far as the gate isolation layer 21. This is as shown in FIG. 4C. The oxide layer 28 (see FIG. 4B) that was formed during production of the protection layer 27 if the passivisation layer was reinforced by oxygen, was eliminated in a previous breakthrough step. If the passivisation layer was reinforced by a polymer deposit, the breakthrough step eliminates the polymer formed on the surface of the layer of gate material 22. This breakthrough step is followed by an anisotropic etching step of the layer of gate material as far as the gate isolation layer 21 due to the same plasma 25 used to etch the top part of the layer of gate material. The result is the formation of another passivisation layer 29 on the sides of the gate 30 thus delimited. This layer 29 is superposed on the protection layer 27 at the top part of the gate 30. Particular plasma conditions prevent formation of the passivisation layer 29 by eliminating oxygen and bromine from the plasma gas phase.

Figure 4D:
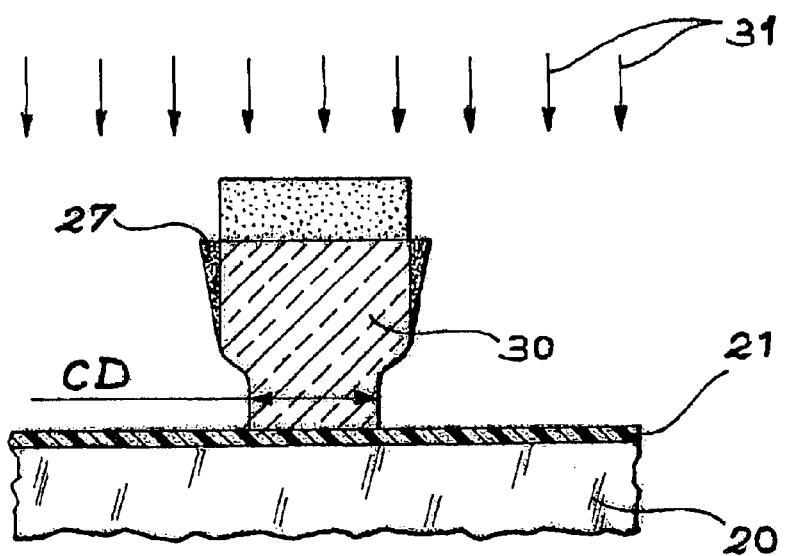

The gate 30 is then exposed to an over-etching plasma 31 so that the gate is machined laterally at the location at which the passivisation layer 29 is not reinforced (see FIG. 4D). The duration of this step adjusts the amplitude of the lateral etching (isotropic etching) without disturbing the anisotropy of the profile over the entire thickness in which the passivisation layer was reinforced. Therefore, the duration of this step will be used to check the length CD of the bottom of the gate. The over-etching step is perfectly selective compared with the gate isolation layer 21. It is also perfectly selective compared with the protection layer 27 formed on the sides of the gate 30.

A second approach consists of performing the over-etching step immediately when the passivisation layer has been reinforced and the breakthrough step has been done, to begin controlled lateral erosion at the bottom of the gate. Thus, the step shown in FIG. 4B is directly followed by the step shown in FIG. 4D. This approach has the important advantage that the gate isolation layer is reached under very mild plasma operating conditions. However, the final check of the length CD of the bottom of the gate is more difficult with this method, since the final length is controlled by the ratio between the vertical and lateral etching speeds of the gate material. On the other hand, with the first approach, only the etching speed affects control over the length CD. Furthermore, the effects of loads can modify the lateral erosion rate when the gate material is completely exposed on the gate isolation. Nevertheless, this approach is still a realistic way of reducing the size of the gate with respect to the dimension defined by the lithography step.

Table II contains an example embodiment of the process according to the invention for a silicon substrate supporting a gate oxide layer made of polysilicon. This example relates to the first approach with a passivisation layer reinforced by an oxygen-based plasma. In this example, it is considered that the plasma is a high-density inductive source that etches 200 mm substrates and that the power injected in the source is of the order of 500 W. The result is that the plasma density is of the order of $10^{11}$ ions/cm$^3$. Gas flows and the working pressures indicated are only given as examples. Flows indicated for each gas can vary within a fairly wide range. The value of the RF power applied to the substrate holder at each step is only given for guidance. These values are different if the power injected in the source is different.

TABLE II

| Step | Chemistry in gaseous phase | Gas flow Pressure | P (W) |
|---|---|---|---|
| Breakthrough | $C_2F_4$ or $Cl_2$ | 100 sccm a few mTorr | 150 < P < 200 |
| Main etching I | $HBr/Cl_2/O_2$ | 150/30/5 sccm a few mTorr | 80 < P < 150 |
| Reinforcement | $O_2$ | 150 sccm > 15 mTorr | P = 0 |
| Breakthrough | $Cl_2$ | 100 sccm a few mTorr | 150 < P < 200 |
| Main etching II | $HBr/Cl_2/O_2$ | 150/30/5 sccm a few mTorr | 50 < P < 80 |
| Over-etching | $HBr/O_2$ | 150/10 sccm > 30 mTorr | 40 < P < 60 |

Reactive gases can also be used that, in the absence of a plasma, can react spontaneously with the gate material to cause lateral erosion at the bottom of the gate.

As a general rule, plasma helps to produce chemically active and electric reactive species (ions and electrons) that participate in etching. The anisotropy of etching results from the synergy between ions and neutral species of the plasma, ionic bombardment significantly accelerating the chemical etching dynamics due to the neutral species. During lateral etching of the bottom of the gate, lateral erosion of the gate material occurs by neutral species of the plasma that react spontaneously with the gate material to form volatile reaction products. Plasma ions do not play any role in this lateral chemical attack since they arrive vertically and not directly on the sides of the gate that are eroded by neutral species.

During this lateral etching step, the process may be complicated by ionic and electronic bombardment due to the plasma. It is important to avoid damaging the gate isolation layer that is bombarded by high-energy plasma ions during the lateral erosion step of the bottom of the gate. The selectivity of etching between the gate material and the gate isolation can then become too weak to prevent damage to future active zones of the transistor. Furthermore, the electric field of the plasma may be sufficiently high so that plasma ions are directly implanted into the substrate through the gate isolation layer, during this lateral erosion step. Finally, the difference in direction between the plasma ions and electrons can produce charge effects provoking electron currents in the gate isolation layer during execution of the process and may cause degradation of this insulation. The result is that there are definite advantages in having a lateral erosion step of the gate in the absence of a plasma.

Therefore, isotropic etching of the layer of the gate material may be done using reactive species reacting with the gate material in the absence of a plasma.

Fluorine based gases are very attractive candidates for isotropic etching of a silicon based material gate (amorphous or polysilicon), the gate isolation layer being made of silicon oxide. At ambient temperature, the ratio of the etching rates of silicon and silicon oxide by atomic fluorine is 44. At 100° C., this ratio is equal to 25. Therefore it is particularly useful to be able to produce a source of atomic fluorine in the absence of a plasma since spontaneous etching of silicon becomes possible without any consumption of the gate oxide. This lateral etching erodes the silicon on the sides of the gate without consuming the gate oxide and without any risk of creating structural or electrical defects in the silicon. Therefore in order to achieve this, it is necessary to select gases which dissociate spontaneously in the absence of a plasma at the silicon surface to produce a source of atomic fluorine. Gases such as $XeF_2$ and $F_2$ are good candidates since these gases efficiently etch silicon in the absence of a plasma.

Furthermore, since the lateral erosion rate depends on the partial pressure of the gas ($XeF_2$ or $F_2$) in the reactor and the substrate temperature, the lateral erosion rate and therefore the final dimension at the bottom of the gate can be controlled extremely precisely to obtain etching profiles of the type shown in FIG. 4D.

The invention is also applicable to cases of structures with a metallic gate. Metallic gates are potentially interesting for microelectronic industries of the future. However, they have the disadvantage that it is very difficult to include them in technological industries. The etching step is particularly difficult to implement since the etching anisotropy and integrity of the gate oxide are very difficult to reconcile for metals. However, the invention is particularly interesting in the case of a layer of gate material composed of a stack of semi-conducting materials on metal.

Figure 5A:
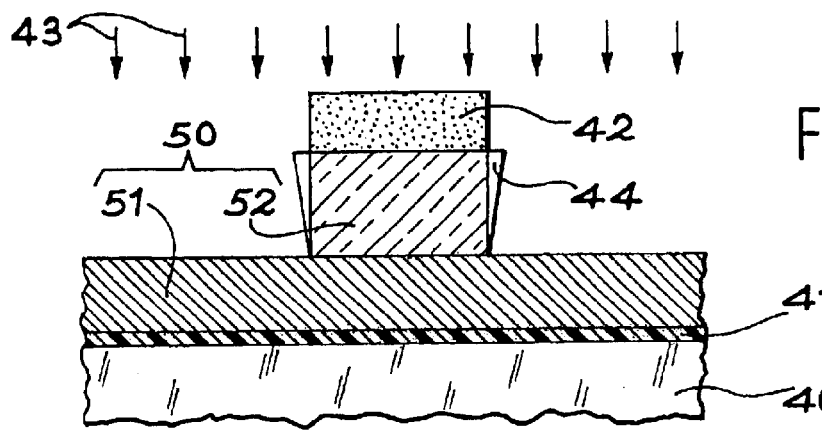
FIGS. 5A to 5C are cross sectional views illustrating steps in a process for making a second CMOS transistor structure according to the invention.
Figure 5B:
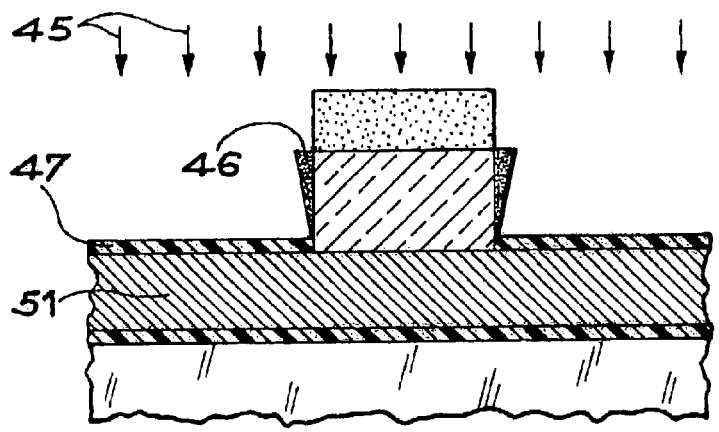
Figure 5C:
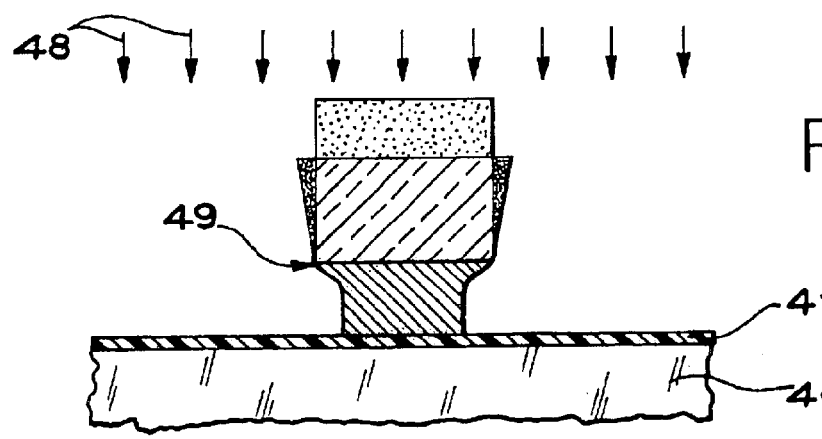

FIGS. 5A to 5C illustrate application of the invention to the case of a metallic gate.

FIG. 5A shows a silicon substrate 40 supporting a silicon oxide layer 41, a layer of gate material 50 and a resin mask 42 in sequence. The layer of gate material 50 comprises a lower metallic sub-layer 51, for example made of Al, W or TiN, and an upper sub-layer 52, for example made of polysilicon or amorphous silicon. FIG. 5A shows the state of the structure during the anisotropic etching step of the upper sub-layer 52 by a plasma 43. A deposit 44 composed of etching products is formed on the sides of the gate being produced. The etching plasma 43 may for example be of the $HBr/Cl_2/O_2$ type.

As above, the passivisation layer is reinforced using an oxygen-based plasma 45 to supply a protection layer 46 (see FIG. 5B). As previously, the passivisation layer may be reinforced by a fluorocarbonated polymer. FIG. 5B shows that the oxygen-based plasma has oxidised the surface of the metallic sub-layer 51 to produce an oxide layer 47.

After a step to breakthrough the oxide layer 47, the metallic sub-layer 51 is etched using an etching plasma 48 that causes isotropic etching while preserving the layer of gate oxide 41. The duration of this step is sufficient to obtain the required dimension at the bottom of the gate. This approach is particularly suitable for metallic gates since these materials are naturally etched isotropically. A gate 49 is obtained comprising a metallic lower part and an upper part made of a semi-conducting material.

What is claimed is:

1. Process for making a gate (30, 49) for CMOS transistor structure for which the gate length is shorter at the bottom than at the top, made from a stack realized on a face in a semi-conducting material of a substrate (20, 40), said stack comprising a gate isolation layer (21, 41), a gate material layer (22, 51, 52) and a gate mask (23, 42) in sequence, the process comprising the following steps:

a) anisotropic etching of the top part of the gate material layer not masked by the gate mask (23, 42), this etching step leaving the bottom part of the gate material layer and leading to the formation of a deposit (24, 44) composed of etching products on the etching sides resulting from the anisotropic etching, c) etching of the bottom part of the gate material layer (21, 41) as far as the gate isolation layer, this etching comprising isotropic etching of the gate material layer to make to the gate (30, 49) a length shorter at the bottom than at the top, characterised in that there is a step b) between steps a) and c), for the treatment of the deposit (24, 44) composed of etching products, to make a protection layer (27, 46) reinforced against etching in step c).

2. Process according to claim 1, characterised in that step c) comprises two sub-steps:

firstly, an anisotropic etching step of the lower part of the gate material layer as far as the gate isolation layer, then a step consisting of submitting the stack to an over-etching plasma that causes said isotropic etching.

3. Process according to claim 1, characterised in that step c) consists of applying an over etching plasma (31) to the stack to reach the gate isolation layer (21) and to make to said gate (30) a length shorter at the bottom than at the top.

4. Process according to claim 1, characterised in that the isotropic etching of the gate material layer is done using reactive species reacting with the gate material in the absence of a plasma.

5. Process according to claim 1, characterised in that the deposit (24, 44) composed of etching products being of the $SiO_xCl_yBr_z$ type where x, y and z<1 and y or z possibly being equal to 0, step b) consists of substituting the chlorine and/or bromine in the deposit composed of etching products, by oxygen.

6. Process according to claim 5, characterised in that the substitution of the chlorine and/or bromine is done by means of a gas plasma comprising at least one gas based on oxygen.

7. Process according to claim 6, characterised in that the gas based on oxygen is chosen from among $O_2$, $O_3$, $H_2O$, $N_2O$, NO, CO, $CO_2$, $SO_2$ or $SO_3$.

8. Process according to either of claim 6 or 7, characterised in that the gas plasma also comprises at least one gas chosen from among Ar, Xe, Kr, $NH_3$ and $N_2$.

9. Process according to claim 1, characterised in that during step b), the treatment of the deposit composed of etching products consists of depositing a polymer layer on said deposit composed of etching products.

10. Process according to claim 9, characterised in that the treatment of the deposit composed of etching products consists of depositing a layer of fluorocarbonated polymer.

11. Process according to claim 10, characterised in that the layer of fluorocarbonated polymer is deposited using a $C_xF_yH_z$ type plasma.

12. Process according to claim 10, characterised in that step b) takes place after placing the substrate on a polarized substrate holder to prevent the deposit of a polymer layer on the surface of the lower part of the layer of gate material and to prevent etching of this surface.

13. Application of the process according to claim 1, for making a gate (30) from a silicon-based material.

14. Application of the process according to claim 1, for making a metallic type gate (49), the layer of gate material (50) comprising a sub-layer based on a semi-conducting material (52) forming the upper part of the gate material layer and a metallic sub-layer (51) forming the lower part of the gate material layer.

* * * * *